(12) United States Patent
Hasegawa

(10) Patent No.: US 7,936,058 B2
(45) Date of Patent: May 3, 2011

(54) STACKED PACKAGE AND METHOD FOR FORMING STACKED PACKAGE

(75) Inventor: Masashi Hasegawa, Tokyo (JP)

(73) Assignee: Kabushiki Kaisha Nihon Micronics (JP)

( * ) Notice: Subject to any disclaimer, the term of this patent is extended or adjusted under 35 U.S.C. 154(b) by 0 days.

(21) Appl. No.: 12/528,739

(22) PCT Filed: May 14, 2007

(86) PCT No.: PCT/JP2007/059863
§ 371 (c)(1),
(2), (4) Date: Aug. 26, 2009

(87) PCT Pub. No.: WO2008/139605
PCT Pub. Date: Nov. 20, 2008

(65) Prior Publication Data
US 2010/0013072 A1    Jan. 21, 2010

(51) Int. Cl.
*H01L 23/02* (2006.01)
(52) U.S. Cl. .................. 257/686; 257/E21.499
(58) Field of Classification Search .................. 257/686, 257/712, 777, E21.499
See application file for complete search history.

(56) References Cited

U.S. PATENT DOCUMENTS

| | | | |
|---|---|---|---|
| 5,051,865 A | 9/1991 | Kato | 361/386 |
| 5,883,426 A * | 3/1999 | Tokuno et al. | 257/686 |
| 6,982,489 B2 * | 1/2006 | Wakiyama et al. | 257/778 |
| 7,015,572 B2 * | 3/2006 | Yamaji | 257/686 |
| 7,196,411 B2 * | 3/2007 | Chang | 257/706 |
| 7,309,911 B2 * | 12/2007 | Bartley et al. | 257/675 |
| 7,400,032 B2 * | 7/2008 | Corisis et al. | 257/686 |
| 7,576,995 B2 * | 8/2009 | Thomas et al. | 361/760 |
| 7,710,286 B1 * | 5/2010 | Thornley et al. | 340/657 |
| 2003/0180451 A1 | 9/2003 | Kodas et al. | 427/123 |
| 2004/0251530 A1 | 12/2004 | Yamaji | 257/686 |
| 2006/0006517 A1 * | 1/2006 | Lee et al. | 257/686 |
| 2006/0049500 A1 * | 3/2006 | Goodwin | 257/686 |
| 2006/0145327 A1 * | 7/2006 | Punzalan et al. | 257/686 |
| 2007/0176277 A1 * | 8/2007 | Brunnbauer et al. | 257/686 |
| 2009/0315168 A1 * | 12/2009 | Coteus et al. | 257/686 |

FOREIGN PATENT DOCUMENTS

| | | |
|---|---|---|
| JP | 2002-033442 | 1/2002 |
| JP | 2004-303884 | 10/2004 |

OTHER PUBLICATIONS

Muhannad S. Bakir and James D. Meindl, "Fully Compatible Low Cost Electrical, Optical, and Fluidic I/O Interconnect Networks for Ultimate Performance 3D Gigascale Systems", pp. 13-1-13-21, Technical Digest of the International 3D System Integration Conference 2007, 3D-SIC 2007, Mar. 26-27, 2007, ASET (Association of Super-Advanced Electronics Technologies).

* cited by examiner

*Primary Examiner* — Nathan W Ha
(74) *Attorney, Agent, or Firm* — Bacon & Thomas, PLLC

(57) ABSTRACT

The present invention provides an inexpensive semiconductor chip module enabling sufficient heat dissipation without complicating the manufacture process.

A semiconductor chip module according to the present invention includes a plurality of semiconductor chips to be stacked provided at the side face with a connection terminal to be coupled with a circuit pattern formed on the front face, interlayer wiring mutually connecting the connection terminals on the side faces of the respective semiconductor chips by a wiring pattern, and a formation space contributing to heat dissipation, formed between at least some layers of the semiconductor chips, to secure a formation face of the interlayer wiring.

9 Claims, 16 Drawing Sheets

162 THROUGH HOLE

161 THROUGH HOLE

US 7,936,058 B2

STACKED PACKAGE AND METHOD FOR FORMING STACKED PACKAGE

TECHNICAL FIELD

The present invention relates to a stacked package and an inter-terminal wiring method for a stacked package, which are applicable for manufacturing a semiconductor chip module in which plural semiconductor chips have been integrated in a stacked state, for example.

BACKGROUND ART

In order to deal with requirements for a recent high-density trend of a semiconductor chip (LSI) and readily deal with requirements for partial specification changes, a three-dimensional semiconductor chip module in which plural semiconductor chips have been stacked, integrated, and electrically interconnected has been proposed.

In conventional three-dimensional semiconductor chip modules, since plural semiconductor chips are stacked, heat generated by power consumption at the time of operations is easy to accumulate inside, and heat dissipation is a more serious task than in the case of single semiconductor chips. Non-Patent Document 1 describes heat dissipation by providing a semiconductor chip board with a fluidic channel extending inside the board from a face (upper face or lower face) on which no semiconductor pattern is provided to a side face. Non-Patent Document 1: Muhannad S. Bakir, James D. Meindl, "Fully Compatible Low Cost Electrical, Optical, and Fluidic I/O Interconnect Networks for Ultimate Performance 3D Gigascale Systems", 3D-SIC 2007, pp. 13-1~13-21, March, 2007

DISCLOSURE OF THE INVENTION

Problems to be Solved by the Invention

However, providing a semiconductor chip board with a fluidic channel requires multiple processes other than processes for providing a semiconductor chip pattern and increases manufacture man-hour, which may not only increase in manufacture cost but also lower yield.

Also, a case where a cross-sectional area of the fluidic channel for heat dissipation is enlarged may degrade the strength of the semiconductor chip, while a case where a cross-sectional area of the fluidic channel for heat dissipation is shrunk may cause fluid (especially in the case of liquid fluid) not to flow well.

Further, since a semiconductor chip at an intermediate layer in a stacked state is not provided with a fluidic channel, sufficient heat dissipation cannot be performed. Although, in this case, it is possible to perform heat dissipation by providing a fluidic channel extending inside the semiconductor chip board from a side face to another side face of the board, such a case causes the aforementioned problems.

The present invention has been made with a view to the above respects, and an object of the present invention is to provide an inexpensive stacked package enabling to perform sufficient heat dissipation without complicating manufacture processes and a method for forming such a stacked package.

MEANS TO SOLVE THE PROBLEMS

A stacked package according to a first invention comprises a plurality of stacked package elements to be stacked provided at the side face with a connection terminal to be coupled with a circuit pattern formed on the front face, interlayer wiring mutually connecting the connection terminals on the side faces of the respective stacked package elements by a wiring pattern, and a formation space contributing to heat dissipation formed between at least some layers of the stacked package elements to secure a formation face of the interlayer wiring.

A second invention is a method for forming a stacked package in which a plurality of stacked package elements have been bonded, and comprises a first step of forming on each of the stacked package elements a connection terminal led at least from the front face to the side face to be coupled with a circuit pattern formed on the front face, a second step of stacking and bonding the plurality of stacked package elements on each of which the connection terminal has been formed and forming a space contributing to heat dissipation formed between at least some layers of the stacked package elements to secure a formation face of interlayer wiring, and a third step of interconnecting the connection terminals on the side faces of the bonded respective stacked package elements by a pattern of the interlayer wiring formed by applying spraying of a conductive material in a mist state and changing of a position to be sprayed.

EFFECT OF THE INVENTION

With the present invention, it is possible to provide an inexpensive stacked package enabling to perform sufficient heat dissipation without complicating manufacture processes and a method for forming such a stacked package.

DESCRIPTION OF THE SYMBOLS

10 . . . wiring forming apparatus, 50 . . . semiconductor wafer, 52 . . . semiconductor chip, 54 . . . connection terminal, 56, 100, 110, 120, 130, 140, 150, 160 . . . three-dimensional semiconductor chip module, 58 . . . interlayer wiring, 101 . . . adhesive, 102, 113, 151 . . . heat dissipation space, 111, 112 . . . spacer, 121, 131 . . . heat dissipation plate, 161, 162 . . . through hole

BEST MODE FOR CARRYING OUT THE INVENTION (A-1) Wiring Forming Apparatus Applied to Formation of Terminal and Side Face Wiring Common to All Embodiments Prior to description of embodiments of a stacked package and a method for forming a stacked package according to the present invention, a wiring forming apparatus for use in formation of a terminal of a stacked package and in formation of wiring among stacked package elements (among layers) are described. It is to be noted in the following description that a stacked package is a three-dimensional semiconductor chip module (LSI module), and that a stacked package element is a semiconductor chip (LSI).

Figure 2:
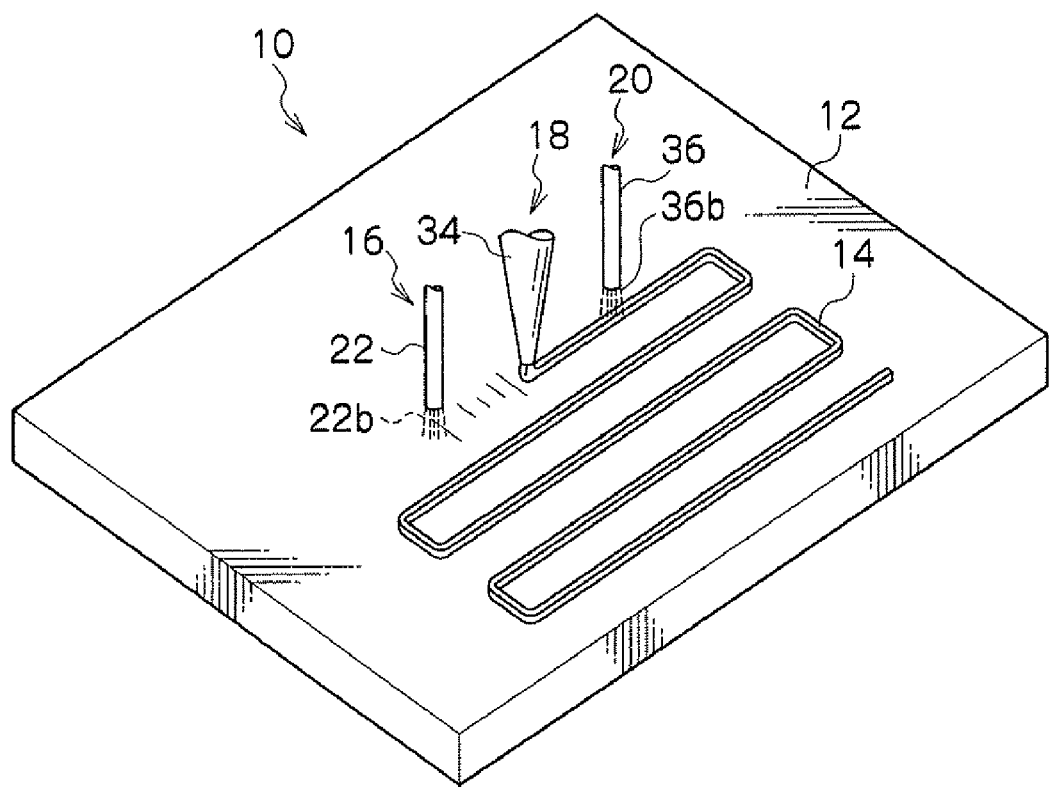
FIG. 2 is a partial schematic view showing one example of a wiring forming apparatus for use in each embodiment.

FIG. 2 is a partial schematic view showing one example of a wiring forming apparatus 10 for use in formation of a terminal of a semiconductor chip and in formation of wiring among terminals of semiconductor chips of a semiconductor chip module.

FIG. 2 shows a use state in which the wiring forming apparatus 10 forms wiring 14 on an object under wiring formation (hereinafter referred to as an insulating substrate in explanation in FIG. 2) 12 in consideration of simplification of explanation on the wiring forming apparatus 10. However, a use state when a terminal for extraction is formed on a semiconductor chip as described later and a use state when wiring is formed to connect connection terminals to one another among semiconductor chips as described later slightly differ from FIG. 2. That is, FIG. 2 is a view just to explain the wiring forming apparatus 10.

The wiring forming apparatus 10 includes a purifying atmospheric plasma generating unit 16, a paste material attaching unit 18, and an oxygen radical molecule jetting unit 20.

Figure 3:
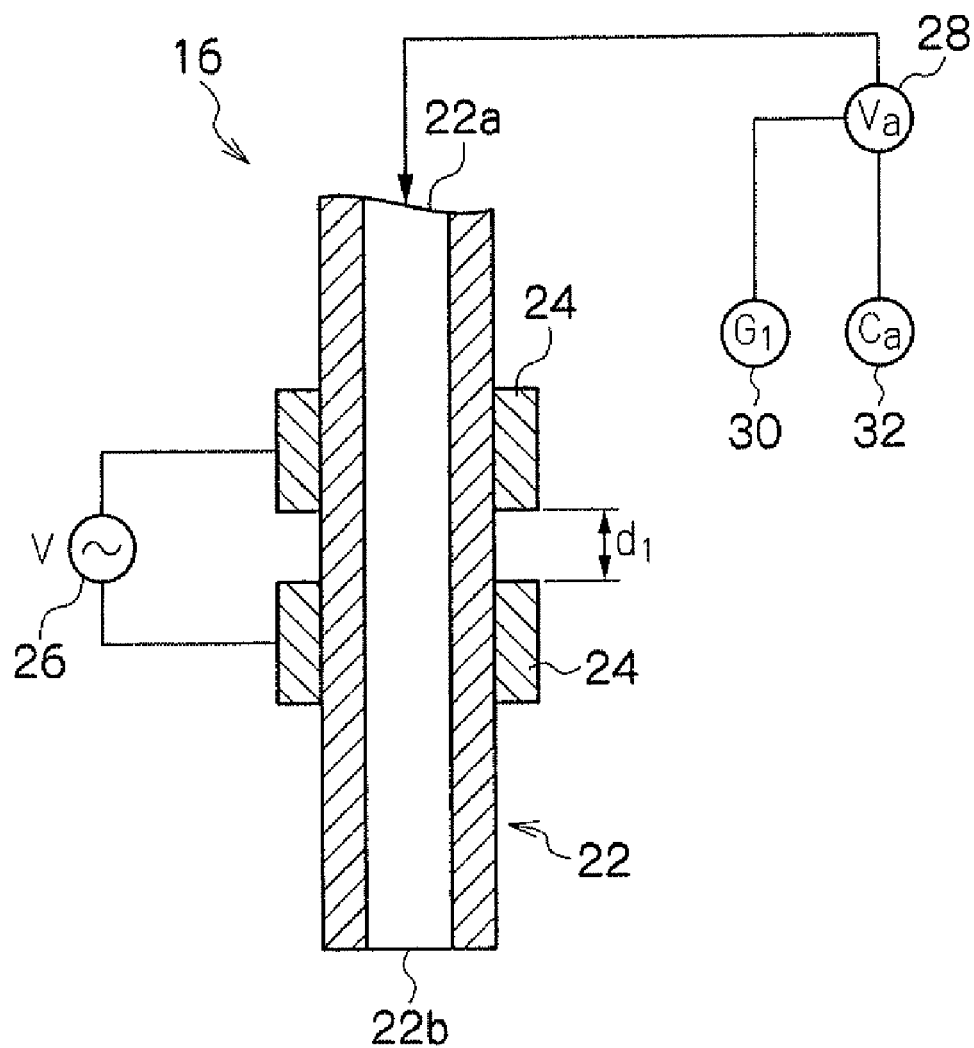
FIG. 3 is a schematic view showing a structure of a purifying atmospheric plasma generating unit in FIG. 2.

The purifying atmospheric plasma generating unit 16 comprises a dielectric tube 22 made of a dielectric such as glass whose upper end is an inlet 22a of gas 30, and whose lower end is a plasma jetting outlet 22b, a pair of electrodes 24, 24 arranged to leave a distance d1 from each other in the longitudinal direction of the dielectric tube 22 and arranged to each surround the dielectric tube 22, and a power unit 26 for applying alternating voltage or pulse voltage between these electrodes, as shown in FIG. 3.

To the gas inlet 22a of the dielectric tube 22, reducing gas G1 such as carbon monoxide gas or hydrogen gas and carrier gas Ca such as nitrogen, argon, or the like can be guided via an opening and closing valve 28. As for the dielectric tube 22, its plasma jetting outlet 22b is directed to the surface of the insulating substrate 12 on which the wiring 14 is to be formed as shown in FIG. 2.

When the opening and closing valve 28 is opened, the carrier gas Ca from a carrier gas source 32 and the reducing gas G1 from a reducing gas source 30 are guided in the dielectric tube 22 toward its plasma jetting outlet 22b. On the flow path of the dielectric tube 22 in which the reducing gas G1 is guided, a discharge space area by dielectric barrier discharge is formed by the pair of electrodes 24, 24 to which voltage is applied from the power unit 26 at an area corresponding to the distance d1 between the two electrodes. Thus, the reducing gas G1 guided from the gas inlet 22a toward the plasma jetting outlet 22b of the dielectric tube 22 comes into a plasma state in the process of passing through this discharge space area. As a result, plasma gas in which this reducing gas G1 is a plasma source is jetted on the insulating substrate 12.

By this jet of the plasma gas from the dielectric tube 22, oxide remaining at a part receiving irradiation of this plasma gas is effectively removed by chemical reaction with this plasma gas. At this time, in the atmospheric plasma in which the reducing gas G1 is a plasma gas source, since the temperature at the irradiated part is maintained at 60 to 80 degrees centigrade, no damage caused by heating is given to the irradiated part and its periphery on the insulating substrate 12.

The dielectric tube 22 or the atmospheric plasma jetting nozzle 22 of the purifying atmospheric plasma generating unit 16 can be moved automatically along a desired pattern with use of a known automatic control mechanism although not shown in the figure. Meanwhile, instead of the atmospheric plasma jetting nozzle 22, the insulating substrate 12 side may be moved automatically along a desired pattern with use of a known automatic control mechanism. That is, a relative movement method between the atmospheric plasma jetting nozzle 22 and the insulating substrate 12 may adopt any of various known methods.

To the area on the insulating substrate 12 purified by jet of the atmospheric plasma gas in which the reducing gas G1 is a plasma gas source, a paste material is supplied from a jetting outlet of a nozzle 34 of the paste material attaching unit 18. By letting the nozzle 34 of the paste material attaching unit 18 follow the nozzle 22 of the purifying atmospheric plasma generating unit 16, the paste material can be supplied and attached in a line form (in a straight or curved line) sequentially on the purified area on the insulating substrate 12.

The paste material, which is a raw material to form the wiring 14, contains nano metal particles and a binder made of organic materials.

The nano metal particle in the paste material is a metal fine particle such as gold or silver showing favorable conductivity with a particle diameter of several nanometers to several hundreds nanometers. Such a metal fine particle has extremely high surface energy, and thus when the metal fine particles contact one another directly, metal sintering occurs by this contact.

The binder in the paste material acts not only to heighten attachment force of the paste material on the insulating substrate 12 but also to protect the metal fine particles from sintering by preventing direct contact between the nano metal particles so as to prevent unnecessary and unexpected metal sintering. Such a binder is conventionally well known as an organic binder and is made of organic materials such as oxygen, carbon, hydrogen, and nitrogen. Also, for the purpose of heightening the protection action by the binder, it is preferable to cover the surface of each nano metal particle with a protective film of the binder.

For such a paste material, "NanoPaste" for sale in Harima Chemicals, Inc. is preferably used.

As a method for attaching the paste material to the insulating substrate 12, a method of spraying the paste material in a mist state by a nozzle using a similar method to an ink jet method (hereinafter referred to as mist jet) can be applied, for example. Also, the paste material may be attached on the insulating substrate appropriately by using an M3D (trademark) unit or another unit. Also, for attachment of the paste material to a desired part, a selection mask that selectively exposes the desired part can be used. Further, other printing methods may be applied. Meanwhile, the M3D (trademark) unit is a Maskless Mesoscale Material Deposition unit (U.S. Pat. No. 7,045,015) by Optomec. Inc, United States.

In the case of the mist jet process, jet from the nozzle 34 can be narrowed jet formed in a spiral shape to form linear wiring.

The wiring forming apparatus 10 is used for formation of a terminal of a semiconductor chip and for formation of wiring among terminals of semiconductor chips of a semiconductor chip module, as described later. For the former formation, the method of attaching the paste material in a mist state is preferably applied since the distance between the nozzle 34 of the paste material attaching unit 18 and the attachment surface of an object under formation changes. For the latter formation, any attachment method may be used.

The wiring pattern portion 14 formed with the paste material in a line form on the insulating substrate 12 receives irradiation of oxygen radical molecules by the oxygen radical molecule jetting unit 20.

Figure 4:
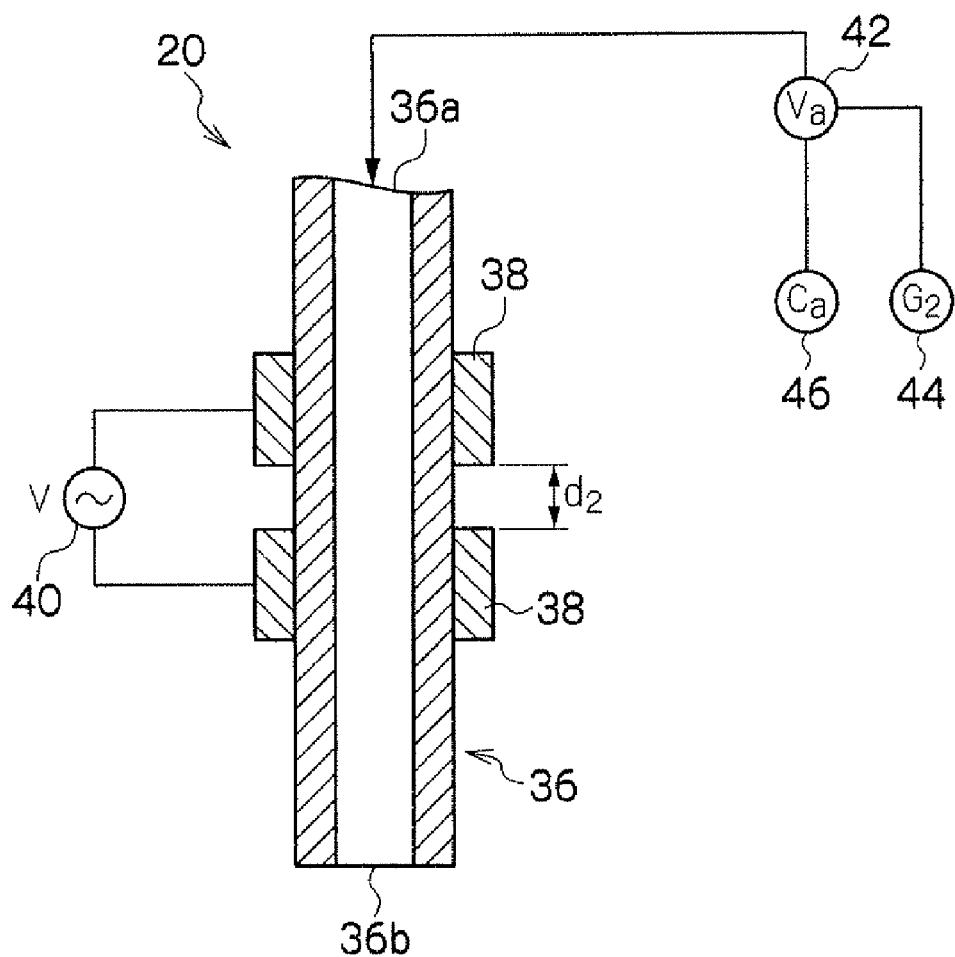
FIG. 4 is a schematic view showing a structure of an oxygen radical molecule jetting unit in FIG. 2.

This oxygen radical molecule jetting unit 20 is structured as shown in FIG. 4, for example, and basically, an atmospheric plasma generating unit having a similar structure to the atmospheric plasma generating unit 16 shown in FIG. 3 is used. The fundamental difference between the two units 16 and 20 is a respect in which the purifying atmospheric plasma generating unit 16 uses the reducing gas source 30 as a plasma gas source while the atmospheric plasma generating unit used as the oxygen radical molecule jetting unit 20 uses an oxide gas source such as oxygen or air as a plasma gas source.

That is, the atmospheric plasma generating unit 20 used as an oxygen radical molecule jetting unit comprises a dielectric tube 36 made of a dielectric such as glass, a pair of electrodes 38, 38 arranged to leave a distance d2 from each other in the longitudinal direction of the dielectric tube 36 and arranged to each surround the dielectric tube 36, and a power unit 40 for applying alternating voltage or pulse voltage between these electrodes, as shown in FIG. 4. Also, to a gas inlet 36a, which is an upper end of the dielectric tube 36, oxide gas G2 such as oxygen gas or air and carrier gas Ca such as nitrogen, argon, or the like are guided via an opening and closing valve 42. As for the dielectric tube 36, its plasma jetting outlet 36b is directed to the formed wiring portion as shown in FIG. 2.

When the opening and closing valve 42 is opened, the carrier gas Ca from a carrier gas source 46 and the oxide gas G2 from an oxide gas source 44 are guided in the dielectric tube 36 toward its plasma jetting outlet 36b. On the flow path of the dielectric tube 36 in which the oxide gas G2 is guided, a discharge space area by dielectric barrier discharge is formed at an area corresponding to the distance d2 between the pair of electrodes 38, 38 to which voltage is applied from the power unit 40. Thus, as in the case of the aforementioned atmospheric plasma generating unit 16, the oxide gas G2 guided from the gas inlet 36a toward the plasma jetting outlet 36b of the dielectric tube 36 comes into a plasma state in the process of passing through this discharge space area.

When the plasma in which the oxide gas G2 is a plasma source is jetted on the insulating substrate 12, oxygen radical contained in the plasma reacts chemically with the organic binder in the paste material of the wiring portion just attached. As a result, the organic binder is removed mainly by the chemical reaction with the oxygen radical. When the organic binder is removed from the wiring portion formed by the aforementioned paste material, the nano metal particles in the wiring portion contact mutually. When this mutual contact occurs, the nano metal particles are sintered by the surface energy of the nano metal particles as described above, and the wiring 14 is formed.

It is preferable to let the dielectric tube of the oxygen radical molecule jetting unit 20, that is to say, the nozzle 36, follow the nozzle 34 of the paste material attaching unit 18 with a predetermined space from the nozzle 34.

Also, it is preferable to lower the temperature of the plasma gas flow jetted from the plasma jetting outlet 36b of the dielectric tube 36 as much as possible for the purpose of raising the content rate of the oxygen radical molecules in the plasma gas jetted from the nozzle 36 of the atmospheric plasma generating unit 20 in which the oxide gas G2 is a plasma gas source and for the purpose of restricting unnecessary temperature rise of the insulating substrate 12. Setting the temperature of the plasma flow jetted from the plasma jetting outlet 36b at 200 degrees centigrade, for example, raises the content rate of the oxygen radical molecules, thereby enabling to remove the organic binder in the wiring portion effectively without causing heating at the periphery and enabling to sinter the nano metal particles by spraying of the plasma gas for a short period of 30 seconds or so.

As for the operation conditions of the respective atmospheric plasma generating units 16, 20, at least either the rise time or the fall time of voltage to be applied to the pairs of electrodes 24, 24 and 38, 38 from the power units 26, 40 can be selected from within the range of 100 microseconds or less, the repetition frequency of the waveform of voltage V from the power units 26, 40 can be selected from within the range of 0.5 to 1000 kHz, and the field intensity applied between the pairs of electrodes 24, 24 and 38, 38 can be selected from within the range of 0.5 to 200 kV/cm, for example. Also, it is preferable to adjust the distance between the plasma jetting outlets 22b, 36b of the respective nozzles 22, 36 and the insulating substrate 12 in the range of 1 to 20 mm, for example.

As each of the plasma generating units 16, 20, a vacuum plasma generating unit may be used. However, it is preferable to use an atmospheric plasma generating unit in order to enable to perform the process in the atmosphere without arranging the insulating substrate 12 under process in a vacuum chamber and to simplify the work and the unit by using the aforementioned atmospheric plasma generating unit.

Also, instead of spraying the oxygen radical molecules to the wiring portion formed with the paste material containing the nano metal particles and the binder made of organic materials, spraying active oxygen (ozone) or gas containing it can remove the organic binder in the paste material and thus contact one another and sinter the nano metal particles in the paste material.

Meanwhile, depending on the state of the insulating substrate 12, the purifying process may be omitted. In this case, one that does not comprise the purifying atmospheric plasma generating unit 16 can be applied as the wiring forming apparatus 10.

Also, by using a similar structure to the paste material attaching unit 18 of the aforementioned wiring forming apparatus 10 and adopting one containing an insulating substance as a paste material, an insulating layer or an insulating pattern can be formed by mist jet, for example. In this case, curing of the insulating layer or the insulating pattern is done by ultraviolet irradiation, for example. In this case, an ultraviolet irradiating unit will be provided at the position of the atmospheric plasma generating unit 20.

(A-2) Overview of Process for Manufacturing Three-Dimensional Semiconductor Chip Module Common to All Embodiments Next, a process for manufacturing a three-dimensional semiconductor chip module approximately common to all embodiments is explained with reference to FIG. 5. The following explanation clarifies positions (order) of a process for forming a terminal of a semiconductor chip and a process for forming wiring among semiconductor chips (among layers) of a semiconductor chip module in a process for manufacturing a three-dimensional semiconductor chip module.

For example, a semiconductor wafer 50 on the surface of which circuit patterns of plural semiconductor chips have been formed is diced into individual semiconductor chips 52 by dicing. It is to be noted that only circuit patterns of the semiconductor chips that will be in the same layer when they are stacked are preferably formed on one wafer 50 (in other words, circuit patterns of the semiconductor chips that are in different layer positions of the stack are not formed on the same semiconductor wafer).

To each semiconductor chip 52 is formed a connection terminal 54 (54*a*, 54*b*) continuously extending over a front face 52*a* and a side face 52*b*. Meanwhile, the end portion on the non-side-face side of the connection terminal 54*a* on the front face 52*a* is electrically connected to the end portion (pad electrode; refer to Reference Number 103 in FIG. 1 described later) of a formed circuit pattern.

Here, it is preferable that the angle formed by the front face 52*a* and the side face 52*b* of the semiconductor chip 52 on which the connection terminal 54 is to be formed should be an obtuse angle although it may be a right angle so as to enable to reduce a defect of the connection terminal 54 at the edge portion. It is also preferable to chamfer the edge portion to some extent. In this case, a process of inclining the side face or chamfering is performed to each diced semiconductor chip 52 in advance before the connection terminal 54 is formed on it. As a process of inclining the side face, end face polishing can be raised. Although FIG. 5 shows a case in which only a face on which the connection terminal 54 is to be formed has been inclined, a face on which no connection terminal 54 is formed may be inclined as well.

Meanwhile, the side face may be smoothed through the inclining process to dispense with the aforementioned purifying process.

Figure 5:
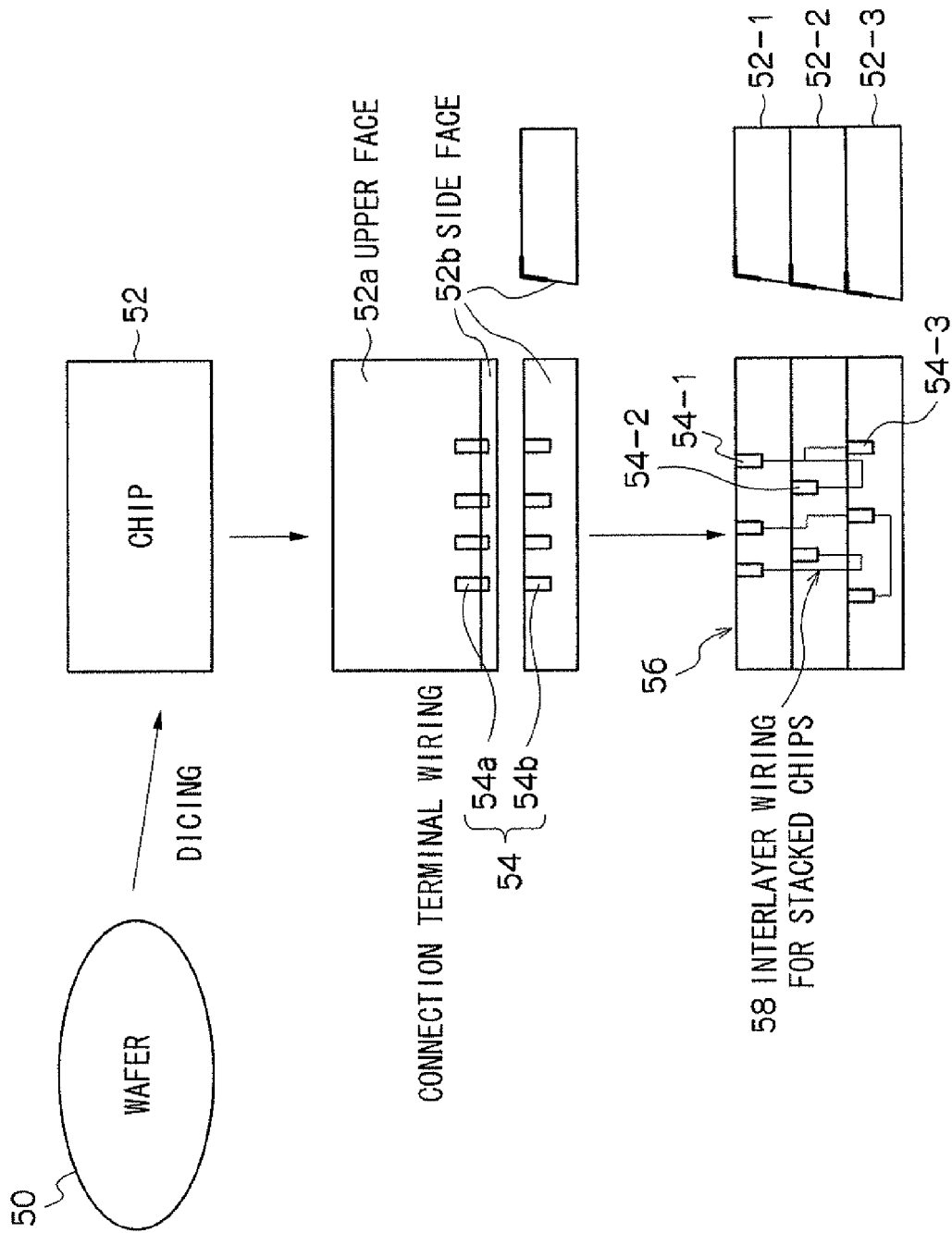
FIG. 5 is a schematic view showing a process for manufacturing a three-dimensional semiconductor chip module approximately common to all embodiments.

Although FIG. 5 shows a case in which one out of four side faces is a side face on which the connection terminal 54 is to be formed, it is to be understood that the connection terminals 54 may be provided on an arbitrary number of side faces.

The semiconductor chips 52-1 to 52-3 for respective layers are stacked and integrated by adhesion or the like. Although not shown in FIG. 5, in each embodiment described later, a space for heat dissipation is formed, or a spacer or a heat dissipation plate is mounted among the semiconductor chips 52-1 to 52-3 for the respective layers in this integration process.

The side face of a three-dimensional semiconductor chip module 56 formed in this manner is in a state where only the connection terminals 54-1 to 54-3 of the semiconductor chips 52-1 to 52-3 in the respective layers are formed, and interlayer wiring 58 is formed to electrically connect these connection terminals 54-1 to 54-3 in different layers in a predetermined wiring pattern.

In a case where the angle formed by the front face 52*a* and the side face 52*b* of each semiconductor chip 52 is an obtuse angle, the side face in each layer just needs to be inclined so that the side faces in the respective layers may become a flat face as a whole.

Also, even when the side faces in the respective layers cannot form a flat face as a whole due to production tolerance in the semiconductor chips 52 in the respective layers to produce unevenness, the following measures are preferable to enable to alleviate the negative effect of the unevenness. That is, it is only necessary to attach the respective layers by applying more adhesive for adhesion among the respective layers than the amount required for mere adhesion and form protrusion of the adhesive so as to alleviate the unevenness by the protrusion of the adhesive. Also, the jetting amount of an inter-layer material by the wiring forming apparatus 10 is increased to the uneven part to prevent cracking.

Figure 6:
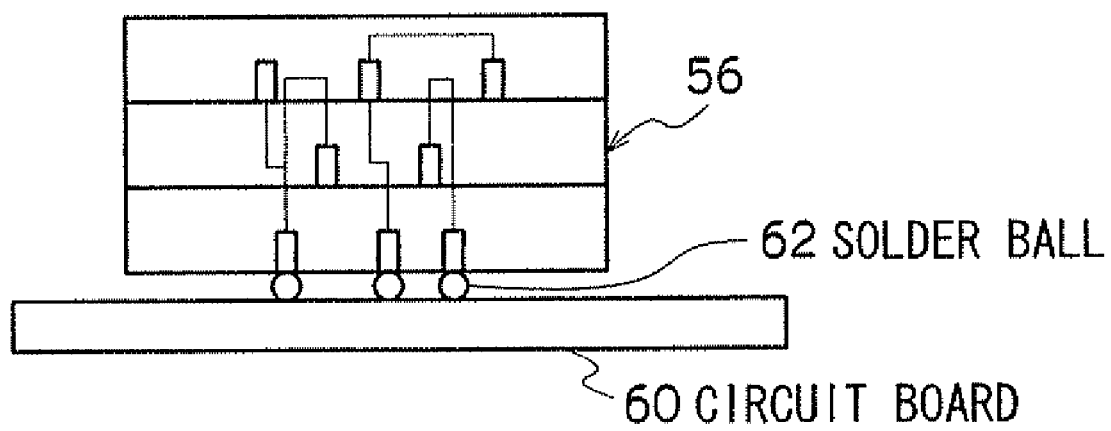
FIG. 6 is a schematic view showing a state of attaching the three-dimensional semiconductor chip module to a circuit board.

The three-dimensional semiconductor chip module 56 formed in the above manner is mounted on a circuit board 60, with the connection terminals in the lowermost layer coupled with terminals and wiring patterns of the circuit board 60 for mounting the three-dimensional semiconductor chip module 56 via solder balls (bump electrodes) 62, as shown in FIG. 6.

The three-dimensional semiconductor chip module 56 is thereafter resin-molded by a synthetic resin, etc., as needed. In this case, a surface of the circuit board 60 not mounting the three-dimensional semiconductor chip module 56 thereon is not resin-molded so as to enable electrical connection between the three-dimensional semiconductor chip module 56 and an outside via the circuit board 60 (refer to Sixth Embodiment described later).

(A-3) Process for Forming Terminal of Semiconductor Chip

Figure 7:
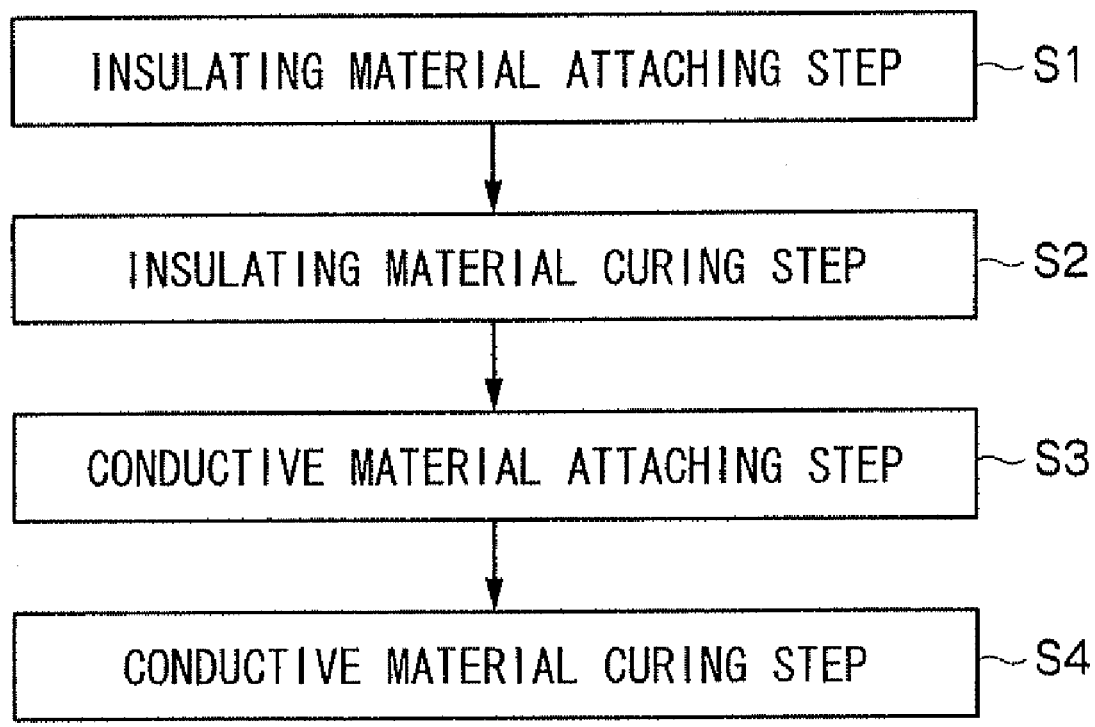
FIG. 7 is a flowchart showing a process for forming a terminal of a semiconductor chip common to all embodiments.

Next, a process for forming a connection terminal on a semiconductor chip is explained in details with reference to a flowchart in FIG. 7.

The process for forming a connection terminal includes an insulating material attaching step S1, an insulating material curing step S2, a conductive material attaching step S3, and a conductive material curing step S4 in this order. It is noted that different steps may be processed in parallel.

The insulating material attaching step S1 is a step of attaching an insulating material to a partial area of a predetermined area to which a connection terminal is provided. The insulating material curing step S2 is a step of curing the insulating material attached to the semiconductor chip 52. The conductive material attaching step S3 is a step of attaching a conductive material that will be a connection terminal. The conductive material curing step S4 is a step of curing the conductive material attached to the semiconductor chip 52.

Figure 8:
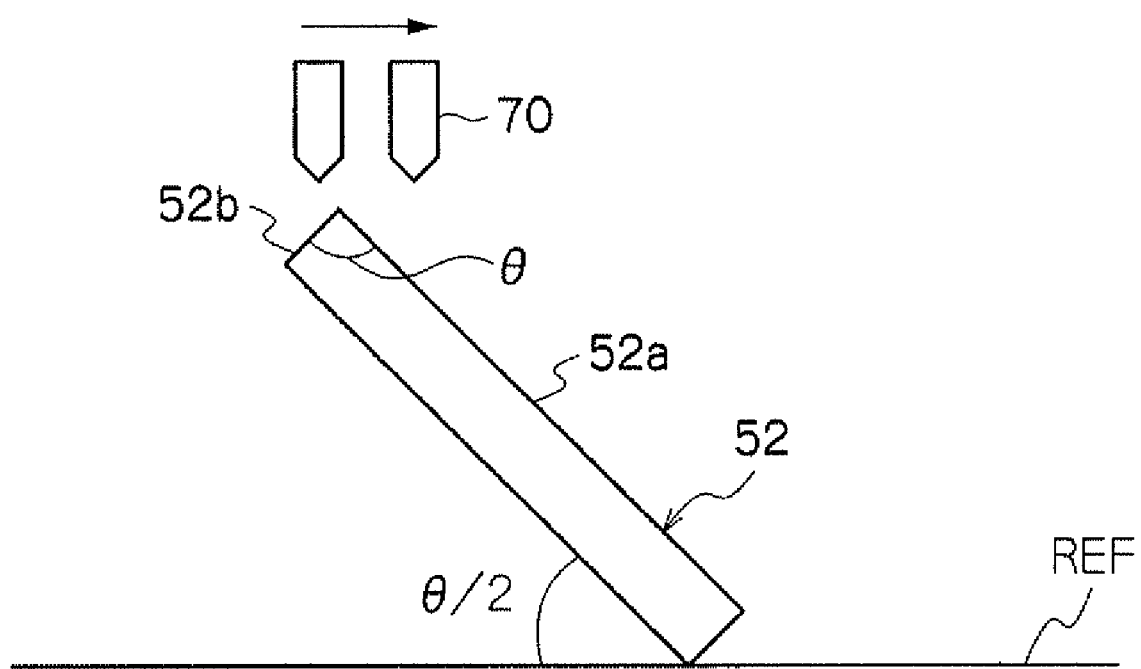
FIG. 8 is a schematic view showing a positional relationship between the semiconductor chip and a nozzle in the process for forming a terminal of a semiconductor chip common to all embodiments.

In any of the steps, the semiconductor chip is installed so that the front face 52*a* of the semiconductor chip 52 may be at a predetermined angle with a reference plane REF, and so that the side face on which the connection terminal 54 is provided may be on the far side from the reference plane REF with use of a dedicated inclined mounting table, a mounting jig, etc., for example, as shown in FIG. 8. The predetermined angle is theta/2 in a case where the angle formed by the front face 52*a* and the side face 52*b* of the semiconductor chip 52 is theta, for example. When theta is 90 degrees, the installation angle is 45 degrees. It is to be noted that a nozzle 70 shown in FIG. 8 differs with the step and jets a different material.

In the insulating material attaching step S1, an insulating material in a mist state is jetted from the nozzle 70 shown in FIG. 8, for example. At this time, the jetting nozzle 70 and the semiconductor chip 52 are moved relatively. The relative movement of the nozzle 70 jetting the insulating material against the semiconductor chip 52 is linear movement (or reverse movement) traveling from the side face 52b of the semiconductor chip 52 via the edge to a predetermined position on the front face 52a, and with one sequential mist jet process, the insulating material is attached to an area (except a connection area with a circuit pattern) approximately covering an area on which the connection terminal 54 is to be provided. Meanwhile, in a case where a stable insulating layer has been provided on the front face of the semiconductor chip 52 on which the connection terminal 54 is to be provided by a process at the time of forming the circuit pattern of the semiconductor chip 52, the insulating material may be attached only to the side face 52b of the semiconductor chip 52.

Meanwhile, prior to the insulating material attaching step S1, the aforementioned purifying process may be performed. Also, the insulating material attaching step S1 may adopt an attachment method other than the mist jet process. For example, a method of applying an insulating material paste may be applied.

A curing method in the insulating material curing step S2 is not limited. In the insulating material curing step S2, a not shown ultraviolet irradiation head may follow the nozzle 70 jetting the insulating material to cure the insulating material attached to the semiconductor chip 52, for example. Also, the semiconductor chip 52 to which the insulating material has been attached may pass through a tunnel in the inside of which ultraviolet is irradiated to cure the insulating material, for example.

In the conductive material attaching step S3, a conductive material that will be a connection terminal 54 is attached to the semiconductor chip 52 by the paste material attaching unit 18 of the aforementioned wiring forming apparatus 10 adopting the mist jet process. That is, at the same time as jetting the mist-like conductive material from the nozzle 70 shown in FIG. 8, the jetting nozzle 70 and the semiconductor chip 52 are moved relatively, to attach the conductive material that will be a connection terminal 54 in a line form by one sequential mist jet process.

As described above, in the case of the mist jet process, jet from the nozzle 70 can be narrowed jet formed in a spiral shape to form linear wiring. Here, controlling the distance between the nozzle 70 and the semiconductor chip 52 can achieve a desired line width by the mist jet process. One end of the connection terminal 54 on the side face may be widened to function as a pad.

The conductive material curing step S4 is one in which the conductive material attached to the semiconductor chip 52 is cured by the oxygen radical molecule jetting unit 20 of the aforementioned wiring forming apparatus 10 and is completed as a connection terminal 54.

Here, by preceding the nozzle for attaching the insulating material and the irradiation head for curing the insulating material before the nozzle for attaching the conductive material and relatively moving, against the semiconductor chip 52, the nozzle for attaching the insulating material, the irradiation head for curing the insulating material, the nozzle for attaching the conductive material, and the nozzle for curing the conductive material as a set, the respective steps in the process for forming a connection terminal can be performed in parallel.

Figure 9:
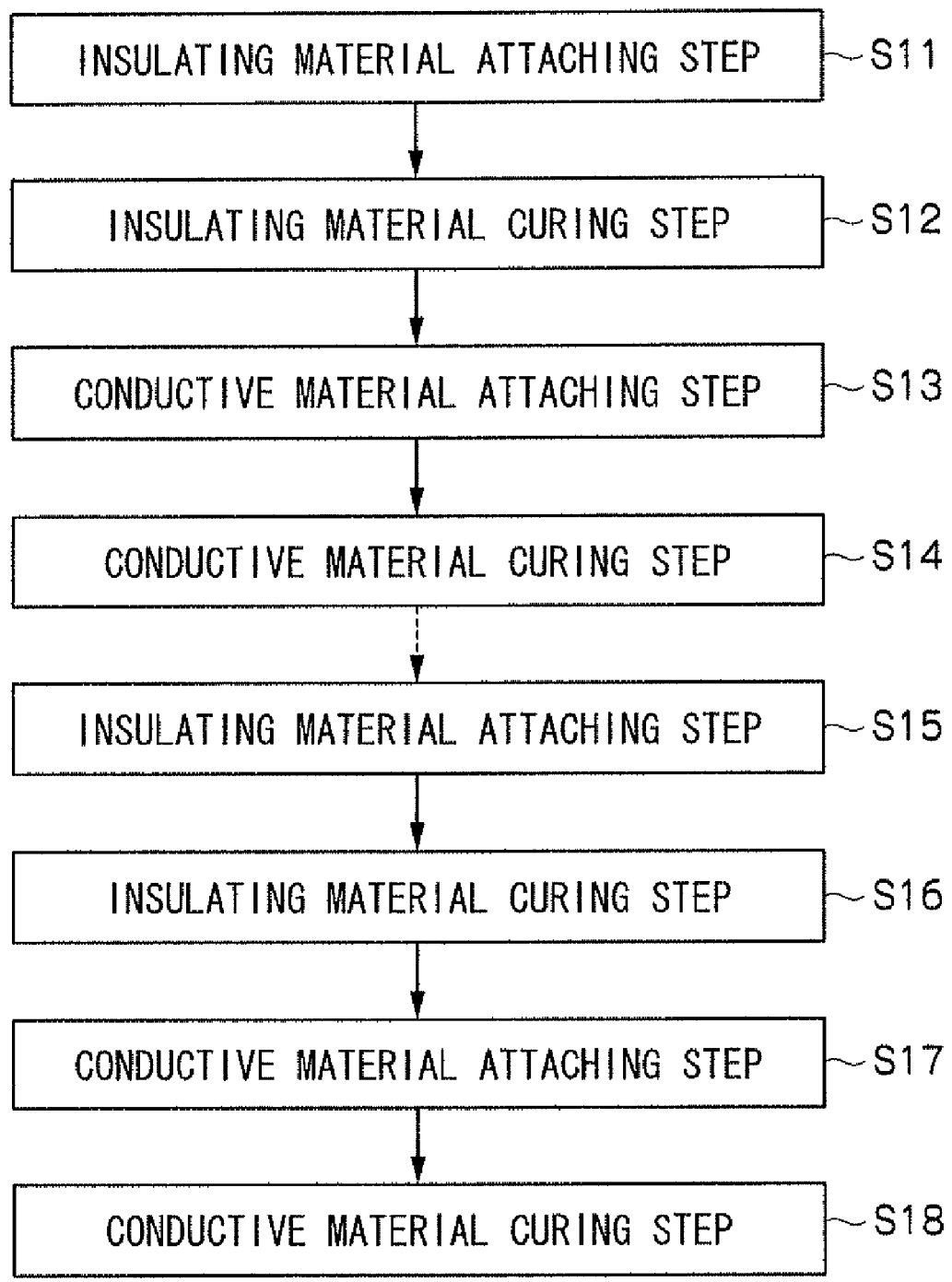
FIG. 9 is a flowchart showing a process for forming wiring among semiconductor chips of a semiconductor chip module common to all embodiments.

(A-4) Process for Forming Wiring Among Semiconductor Chips of Semiconductor Chip Module Next, a process for forming wiring among semiconductor chips (among layers) of a semiconductor chip module is explained in details with reference to a flowchart in FIG. 9.

The process for forming wiring among semiconductor chips also includes an insulating material attaching step S11, an insulating material curing step S12, a conductive material attaching step S13, and a conductive material curing step S14 in this order. Here, in a case where intersection exists in wiring to be formed, an insulating material attaching step S15, an insulating material curing step S16, a conductive material attaching step S17, and a conductive material curing step S18 are further required to form wiring on the upper side in the intersection. It is noted that different steps may be processed in parallel.

The insulating material attaching steps S11, S15, the insulating material curing steps S12, S16, the conductive material attaching steps S13, S17, and the conductive material curing steps S14, S18 are processes similar to the similar steps S1, S2, S3, S4 in the process for forming a terminal of a semiconductor chip, respectively.

Meanwhile, since an object on which wiring is formed is a whole side face of a three-dimensional semiconductor chip module 58 having the connection terminals 54, the whole side face needs to be opposed to the various nozzles.

Also, a wiring pattern to be formed in the process for forming wiring among semiconductor chips may be arbitrary as illustrated in FIG. 6, and formation of such an arbitrary wiring pattern is executed by controlling the positions of the various nozzles by an NC (numerical control) system, for example.

The method for forming the insulating pattern is not limited to the above method. For example, instead of the insulating material attaching step S11 and the insulating material curing step S12 or the insulating material attaching step S15 and the insulating material curing step S16, the following method for forming the insulating pattern may be applied. An insulating film (polyimide, glass, etc.) on which holes (including elongated holes) have been opened at necessary parts by laser in advance is attached to the side face to insulate the parts. In this case, wiring is provided on the insulating film.

(B) First Embodiment

Next, a first embodiment of a stacked package and a method for forming a stacked package (a three-dimensional semiconductor chip module and a method for forming a three-dimensional semiconductor chip module) is explained with reference to the drawings.

Figure 1A:
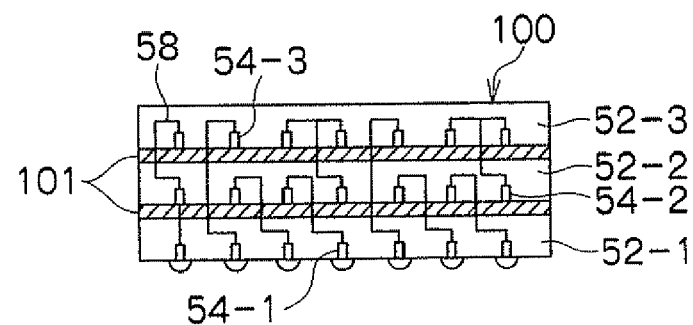
FIG. 1 is a schematic view showing a structure of a three-dimensional semiconductor chip module according to a first embodiment.
Figure 1B:
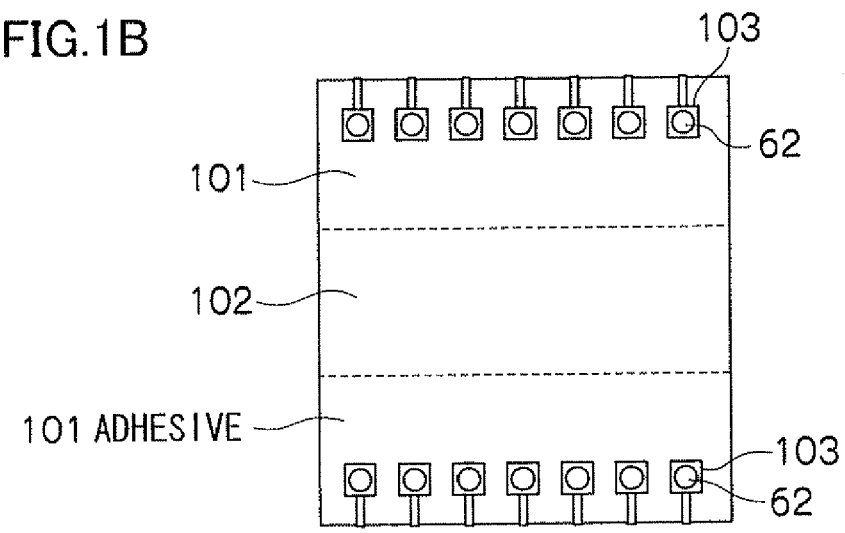
Figure 1C:
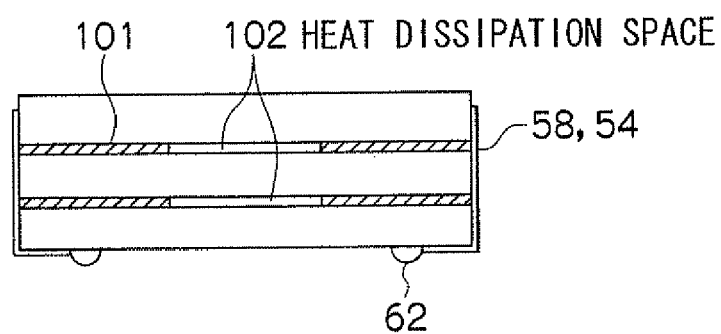

FIG. 1 is a schematic view showing a three-dimensional semiconductor chip module according to a first embodiment; FIG. 1A is a front view, FIG. 1B is a bottom view, and FIG. 1C is a right side view.

In FIG. 1, in a three-dimensional semiconductor chip module 100 of the first embodiment, the connection terminal wires 54-1 to 54-3 of the respective semiconductor chips 52-1 to 52-3 and the interlayer wiring 58 are formed on two opposed side faces out of the four side faces, as shown in FIGS. 1A to 1C.

In the case of this first embodiment, when the respective semiconductor chips 52-1 to 52-3 are stacked and attached, adhesives 101 are applied, e.g., each to have a thickness, only to side faces on which the connection terminal wires 54-1 to 54-3 and the interlayer wiring 58 are formed (although the adhesives 101 are hatched in FIGS. 1A to 1C, the hatched parts do not represent cross-sections but highlight regions of the adhesives 101). Here, as the adhesive 101, one with low fluidity is applied, and spaces (heat dissipation spaces) 102 contributing to heat dissipation are formed between the two attached semiconductor chips 52-1 and 52-2 and between 52-2 and 52-3.

Meanwhile, to faces of each of the semiconductor chips 52-1 to 52-3 to which the adhesives 101 are applied may be provided damming steps to prevent the adhesives 101 from moving any more. Also, the adhesives 101 applied on a sheet or the like may be transcribed to achieve partial application of the adhesives 101 to the faces of the semiconductor chips 101-1 to 101-3. Further, adhesives that are in sheet forms in a normal state may be sandwiched between the two semiconductor chips to attach them so as to achieve partial application of the adhesives 101 to the faces of the semiconductor chips 52-1 to 52-3.

According to the first embodiment, since the heat dissipation space 102 is formed by a space in which no adhesive 101 is provided, favorable heat dissipation can be attained at the time of operation of the three-dimensional semiconductor chip module 100. That is, even when the length in the thickness direction is short, a space having a sufficient length in the orthogonal direction acts as a heat dissipation space and can contribute to heat dissipation more than a hole-like heat dissipation channel.

Since the heat dissipation space 102 exerting such effects can be formed by partial adhesion of the adhesives 101, the measures for heat dissipation will not increase manufacture man-hour and manufacture cost.

Also, in a case of a large number of stacked semiconductor chips, the heat dissipation spaces 102 in the first embodiment can be used for heat dissipation for semiconductor chips at intermediate positions of the stack.

Even when the above heat dissipation spaces 102 are provided, the connection terminals are formed on the front and side faces of the semiconductor chips, and an arbitrary wiring pattern (interlayer wiring) is formed on the side faces of each semiconductor chip on which the connection terminals are formed, which enables reliable electrical connection among the respective semiconductor chips.

Figure 10:
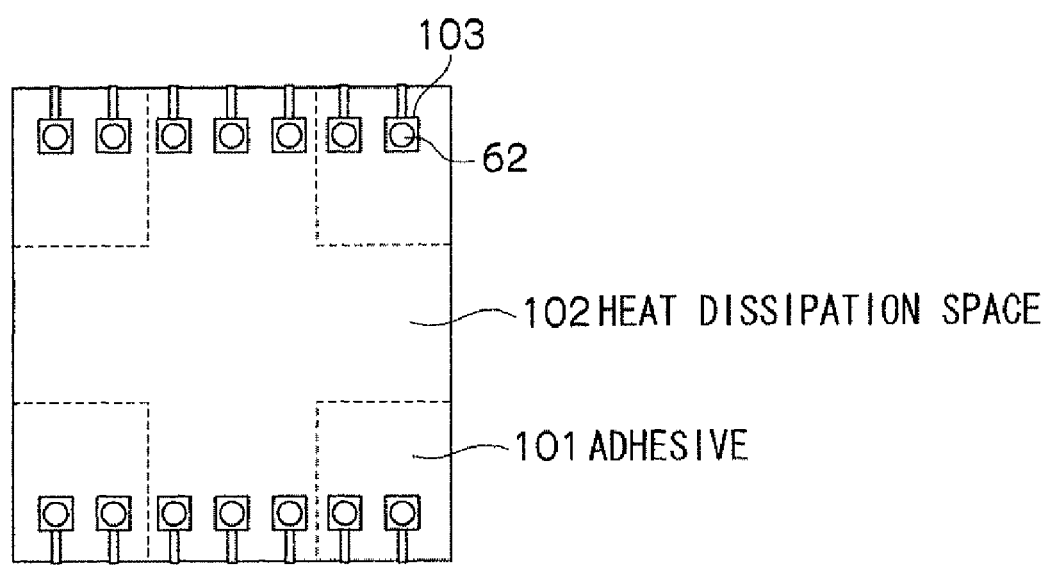
FIG. 10 is a schematic view showing a structure of a three-dimensional semiconductor chip module according to a modification embodiment of the first embodiment.

FIG. 10 is a schematic view showing a structure of a three-dimensional semiconductor chip module according to a modification embodiment of the first embodiment and corresponds to FIG. 1B described above.

Although the heat dissipation space 102 is in a "−" form when it is projected on the bottom face in the first embodiment, the heat dissipation space 102 may be in a "+" form when it is projected on the bottom face as shown in FIG. 10. In such a case, the adhesives 101 are applied to the four edges of the semiconductor chip 52 to form a "+"-shaped heat dissipation space 102.

Meanwhile, in the case of the three-dimensional semiconductor chip module shown in FIG. 10, openings communicating into the heat dissipation space 102 are formed on the side faces to which the interlayer wiring 58 is formed, and the interlayer wiring 58 has only to be formed to keep off these openings.

(C) Second Embodiment

Next, a second embodiment of a stacked package and a method for forming a stacked package (a three-dimensional semiconductor chip module and a method for forming a three-dimensional semiconductor chip module) according to the present invention is explained with reference to the drawings.

Figure 11A:
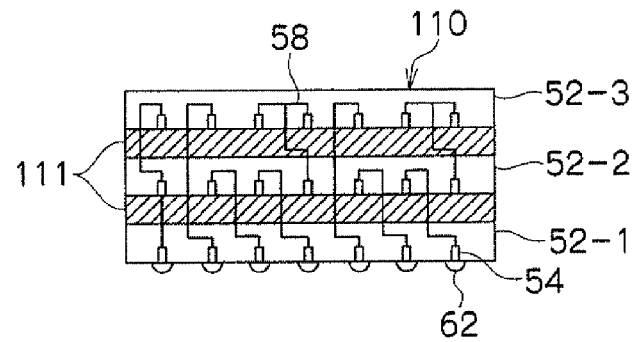
FIG. 11 is a schematic view showing a three-dimensional semiconductor chip module according to a second embodiment.
Figure 11B:
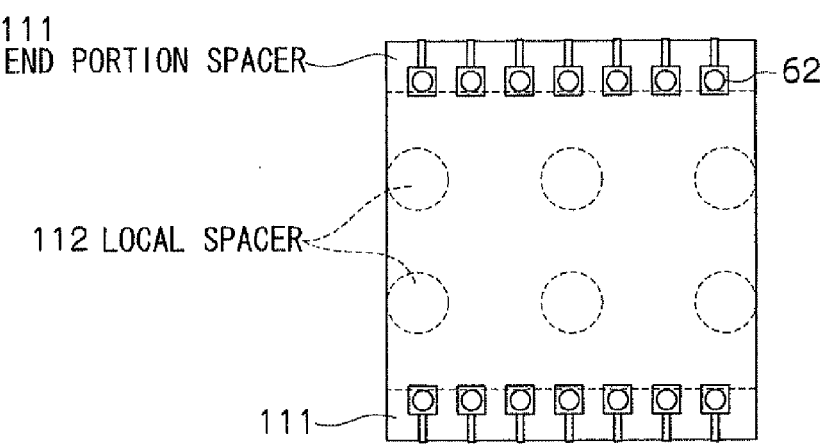
Figure 11C:
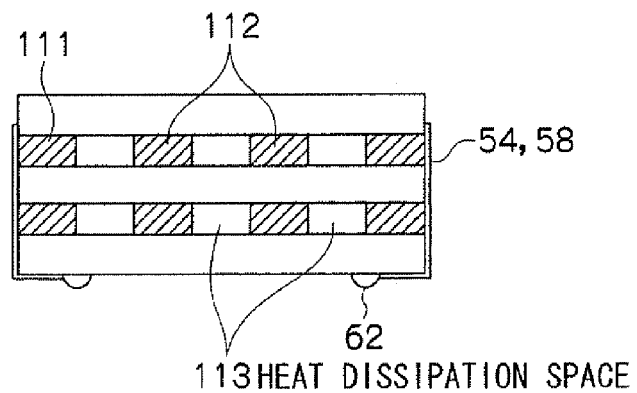

FIG. 11 is a schematic view showing a three-dimensional semiconductor chip module according to a second embodiment; FIG. 11A is a front view, FIG. 11B is a bottom view, and FIG. 11C is a right side view.

In FIG. 11, in a three-dimensional semiconductor chip module 110 of the second embodiment as well, the connection terminal wires 54-1 to 54-3 of the respective semiconductor chips 52-1 to 52-3 and the interlayer wiring 58 are formed on two opposed side faces out of the four side faces, as shown in FIGS. 11A to 11C.

While the heat dissipation space 102 is formed with use of adhesion of the adhesives 101 in the three-dimensional semiconductor chip module 100 of the aforementioned first embodiment, a heat dissipation space 113 is formed with use of spacers (although the spacers 111, 112 are hatched in FIGS. 11A to 11C, the hatched parts do not represent cross-sections but highlight regions of the spacers 111, 112) in this second embodiment. That is, end portion spacers 111 are provided in the respective vicinities of two side faces having formed thereon the interlayer wiring 58, and plural (six in FIG. 6) local spacers 112 are provided and scattered in an internal space formed by a pair of end portion spacers 111. Although the shape of the local spacer 112 is not limited, FIG. 11 shows a circular spacer. A portion of the internal space formed by the pair of end portion spacers 111 except the local spacers 112 forms a heat dissipation space 113.

It is to be noted that any existing method may be used as a method for attaching the spacers 111, 112 to the semiconductor chips 52-1 to 52-3. For example, adhesion or fitting may be used, or the entirety of the stacked semiconductor chips 52-1 to 52-3 including the spacers 111, 112 (the entire sandwich) may be fastened with a string-like member.

Also, the number of the local spacers 112 to be scattered and arranged shall be selected in accordance with the size of the internal space formed by the pair of end portion spacers 111 as well as from the viewpoint of prevention of the semiconductor chips 52-1 to 52-3 from warping. In a case where the internal space formed by the pair of end portion spacers 111 is small, the local spacers 112 may be omitted.

Among the end portion spacers 111 and the local spacers 112, at least the end portion spacers 111 are made of insulators. However, the end portion spacers 111 may be made of conductors, in which case, portions of the end portion spacers 111 to which the interlayer wiring 58 is to be formed need to be covered with insulators before formation of the interlayer wiring 58 is started.

The local spacers 112 are preferably positioned at positions at which the wiring patterns of the semiconductor chips 52-1 to 52-3 are not provided, in which case, either insulators or conductors may be applied. In a case where the local spacers 112 are positioned to contact the wiring patterns of the semiconductor chips 52-1 to 52-3, insulators shall be applied.

Also, the end portion spacers 111 and the local spacers 112 are preferably constituted by elastic bodies so as not to damage the semiconductor chips 52-1 to 52-3 and preferably have heat conductivity equivalent to that of the semiconductor chips 52-1 to 52-3 with respect to stability of relative positional relationship with the semiconductor chips 52-1 to 52-3.

With the second embodiment as well, since the heat dissipation space 113 is formed via the spacers, it is possible to provide an inexpensive three-dimensional semiconductor chip module enabling to perform sufficient heat dissipation without complicating manufacture processes and a method for forming the same.

In the second embodiment, the aforementioned heat dissipation space 113 can be formed on the premise of forming the connection terminals on the side faces of the respective semiconductor chips and then doing interlayer wiring with use of the side faces.

(D) Third Embodiment

Next, a third embodiment of a stacked package and a method for forming a stacked package (a three-dimensional semiconductor chip module and a method for forming a three-dimensional semiconductor chip module) according to the present invention is explained with reference to the drawings.

Figure 12A:
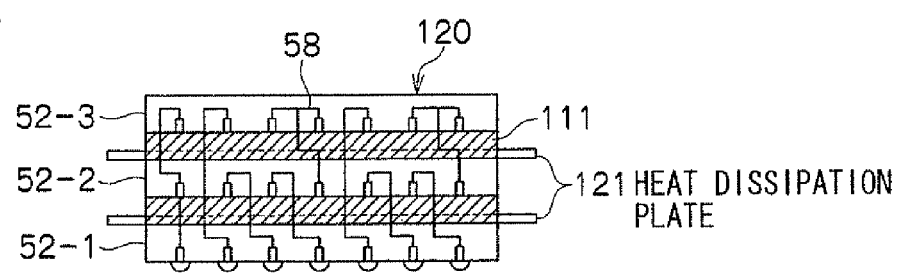
FIG. 12 is a schematic view showing a three-dimensional semiconductor chip module according to a third embodiment.
Figure 12B:
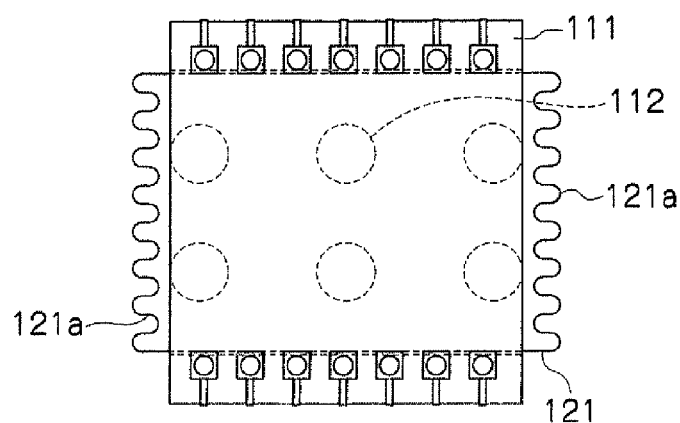
Figure 12C:
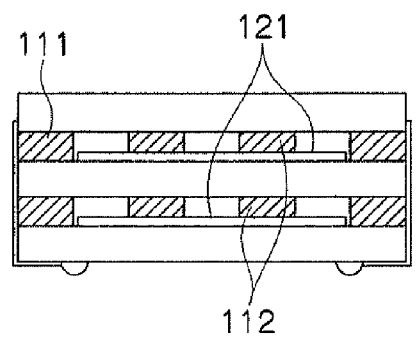

FIG. 12 is a schematic view showing a three-dimensional semiconductor chip module according to a third embodiment; FIG. 12A is a front view, FIG. 12B is a bottom view, and FIG. 12C is a right side view.

In FIG. 12, a three-dimensional semiconductor chip module 120 according to the third embodiment is one by adding heat dissipation plates 121 to the structure of the aforementioned three-dimensional semiconductor chip module 110 according to the second embodiment.

The heat dissipation plate 121 is a plate-shaped member extending between the pair of end portion spacers 111 in parallel with the end portion spacers 111, and both the ends in its extending direction are pulled out of the heat dissipation space 113. A surface of the heat dissipation plate 121 contacts the semiconductor chip 52 while the other surface contacts the local spacers 112. That is, the heat dissipation plate 121 is clamped by a surface of the semiconductor chip 52 and the local spacers 112. Meanwhile, although the heat dissipation plate 121 may be attached to the semiconductor chip 52 or the local spacers 112 by adhesion, the heat dissipation plate 121 is preferably installed by clamping since a material having higher heat conductivity than other members is applied to the heat dissipation plate 121 in many cases to heighten the heat dissipation effect, and the attachment portion is easy to be detached due to difference in heat conductivity from other members.

Edges 121a, portions pulled out of the heat dissipation plate 121, are formed, e.g., in wave-like shapes (e.g., sinusoidal waves, sawtooth waves, etc.) and are adapted to function as heat dissipation fins.

With the third embodiment, the heat dissipation effect can be heightened more than in the second embodiment. That is, cooling can be done not only by heat dissipation by natural convection of air from the inside to the outside of the heat dissipation space 113 but also by outward pulling of internal heat by heat conduction by the heat dissipation plate 121 and heat exchange with air at the pulled-out portions of the heat dissipation plate 121.

Figure 13:
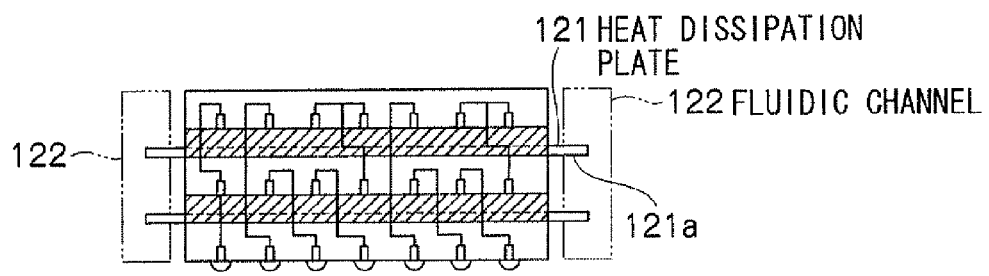
FIG. 13 is a schematic view showing a structure of a three-dimensional semiconductor chip module according to a modification embodiment of the third embodiment.

FIG. 13 is a schematic view showing a structure of a three-dimensional semiconductor chip module according to a modification embodiment of the third embodiment and corresponds to FIG. 12A described above.

Although heat exchange with the heat dissipation plate 121 by natural air cooling has been shown in the third embodiment, the wave-like edges 121a of the heat dissipation plate 121 are linked to fluidic channels 122 for forced cooling to forcedly cool the semiconductor chip 52 by heat exchange with fluid (it may be liquid or gas) flowing in the fluidic channels 122 in this modification embodiment.

(E) Fourth Embodiment

Next, a fourth embodiment of a stacked package and a method for forming a stacked package (a three-dimensional semiconductor chip module and a method for forming a three-dimensional semiconductor chip module) according to the present invention is explained with reference to the drawings.

Figure 14:
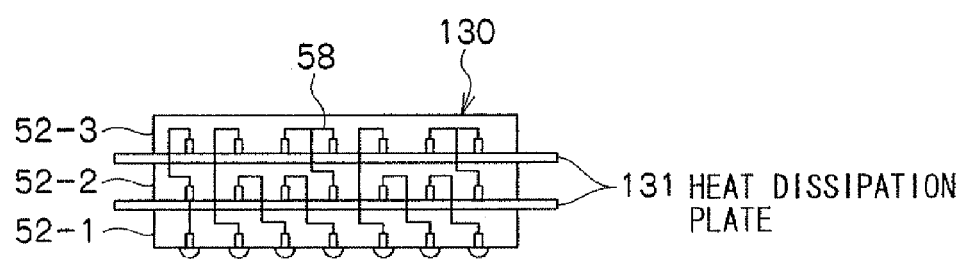
FIG. 14 is a schematic view showing a three-dimensional semiconductor chip module according to a fourth embodiment.

FIG. 14 is a schematic view showing a three-dimensional semiconductor chip module according to a fourth embodiment and corresponds to FIG. 1A, FIG. 11A, FIG. 12A, etc., according to the aforementioned embodiments.

In FIG. 14, a three-dimensional semiconductor chip module 130 according to the fourth embodiment is one in which the semiconductor chips 52 and heat dissipation plates 131 are stacked alternately. It is to be noted that any existing method for attaching the semiconductor chips 52 and the heat dissipation plates 131 may be applied.

The heat dissipation plate 131 in this fourth embodiment differs from the heat dissipation plate 121 in the third embodiment, and its length in the width direction is equivalent to the length between a pair of side faces on which the interlayer wiring 58 is formed. That is to say, in this fourth embodiment, the edges in the width direction of the heat dissipation plate 121 are used as areas to form the interlayer wiring 58. The heat dissipation plate 121 may be made of either material, an insulator or a conductor, but in a case where it is made of a conductive material, a portion to which the interlayer wiring 58 is to be formed needs to undergo an insulating process in advance before the interlayer wiring 58 is formed.

On the other hand, edges 131a in the extending direction pulled outside are preferably formed in wave-like shapes in a similar manner to that in the third embodiment.

Since the three-dimensional semiconductor chip module 130 has a stacked structure of the semiconductor chips 52 and the heat dissipation plates 131, the semiconductor chips 52 and the heat dissipation plates 131 preferably have equivalent heat conductivity so as to prevent detachment of the semiconductor chips 52 and the heat dissipation plates 131 from one another.

With the fourth embodiment, since the three-dimensional semiconductor chip module 130 is constituted by stacking the semiconductor chips 52 and the heat dissipation plates 131 alternately, it is possible to provide an inexpensive three-dimensional semiconductor chip module enabling to perform sufficient heat dissipation without complicating manufacture processes and a method for forming the same.

In the fourth embodiment, the aforementioned alternate stacking of the semiconductor chips 52 and the heat dissipation plates 131 can be done on the premise of forming the connection terminals on the side faces of the respective semiconductor chips and then forming the interlayer wiring 58 with use of the side faces.

(F) Fifth Embodiment

Next, a fifth embodiment of a stacked package and a method for forming a stacked package (a three-dimensional semiconductor chip module and a method for forming a three-dimensional semiconductor chip module) according to the present invention is explained with reference to the drawings.

Figure 15:
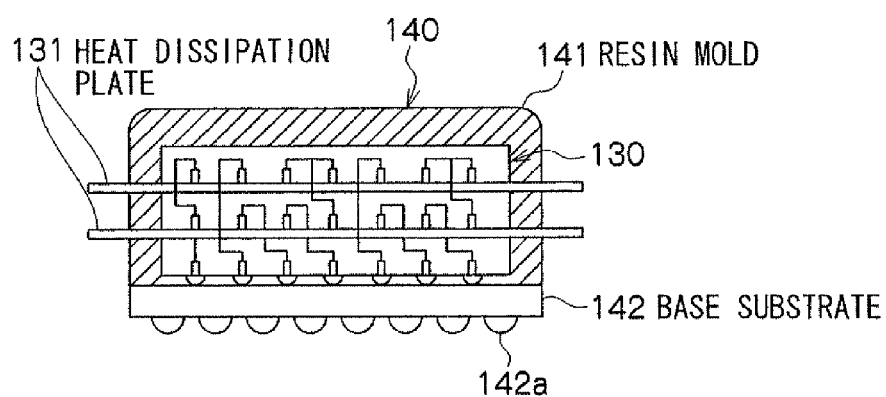
FIG. 15 is a schematic view showing a three-dimensional semiconductor chip module according to a fifth embodiment.

FIG. 15 is a schematic view showing a three-dimensional semiconductor chip module according to a fifth embodiment and approximately corresponds to FIG. 14 according to the aforementioned fourth embodiment. FIG. 15 shows a cross-section of only a resin mold 141 part by splitting it in half and excluding a half.

In FIG. 15, a three-dimensional semiconductor chip module 140 according to the fifth embodiment is one in which the three-dimensional semiconductor chip module 130 in the aforementioned fourth embodiment is mounted on a base substrate 142, and in which a resin mold 141 is provided. Also, the surface of the base substrate 142 directing outside is provided with bump electrodes 142a, and the base substrate 142 has wiring to electrically connect the bump electrodes 62 in the three-dimensional semiconductor chip module 130 and the aforementioned bump electrodes 142a although it is omitted in FIG. 15.

In the three-dimensional semiconductor chip module 140, the wave-like edges 131a of the heat dissipation plate 131 penetrate the resin mold 141 and go outside. That is, a heat dissipation effect can be exerted even with the resin mold 141.

As described above, the fifth embodiment can exert a similar effect to that in the fourth embodiment even with resin molding.

(G) Sixth Embodiment

Next, a sixth embodiment of a stacked package and a method for forming a stacked package (a three-dimensional semiconductor chip module and a method for forming a three-dimensional semiconductor chip module) according to the present invention is explained with reference to the drawings.

Figure 16:
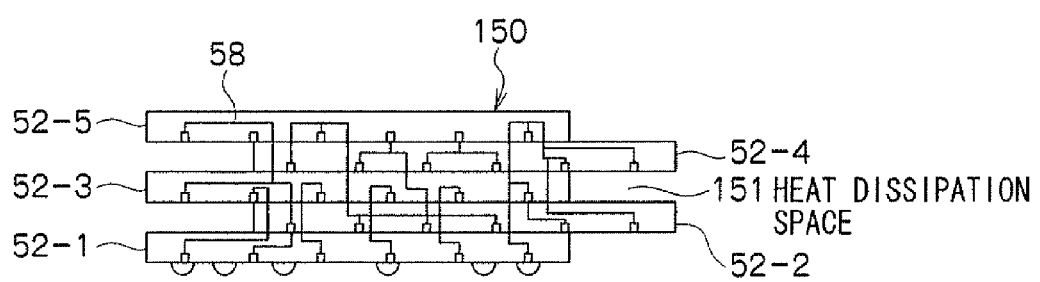
FIG. 16 is a schematic view showing a three-dimensional semiconductor chip module according to a sixth embodiment.

FIG. 16 is a schematic view showing a three-dimensional semiconductor chip module according to a sixth embodiment and corresponds to FIGS. 14 and 15 according to the aforementioned embodiments.

In FIG. 16, a three-dimensional semiconductor chip module 150 according to the sixth embodiment is one in which the respective semiconductor chips 52-1 to 52-5 are displaced alternately in the right-left direction in FIG. 16 and stacked so that the flatness of the side faces on which the interlayer wiring 58 is formed afterward may be kept, and so that the side faces on which the interlayer wiring 58 is not formed may be formed in comb-toothed shapes. That is to say, due to the comb-toothed shapes, the void spaces constitute heat dissipation spaces 151 and perform heat dissipation.

With the sixth embodiment, since the respective semiconductor chips 52 are stacked so that the side faces on which the interlayer wiring 58 is not formed may be formed in comb-toothed shapes and constituted to perform heat dissipation, it is possible to provide an inexpensive three-dimensional semiconductor chip module enabling to perform sufficient heat dissipation without complicating manufacture processes and a method for forming the same.

In the sixth embodiment, the respective semiconductor chips 52 can be stacked so that the side faces on which the interlayer wiring 58 is not formed may be formed in comb-toothed shapes as described above on the premise of forming the connection terminals on the side faces of the respective semiconductor chips and then forming the interlayer wiring 58 with use of the side faces.

(H) Seventh Embodiment

Next, a seventh embodiment of a stacked package and a method for forming a stacked package (a three-dimensional semiconductor chip module and a method for forming a three-dimensional semiconductor chip module) according to the present invention is explained with reference to the drawings.

Figure 17A:
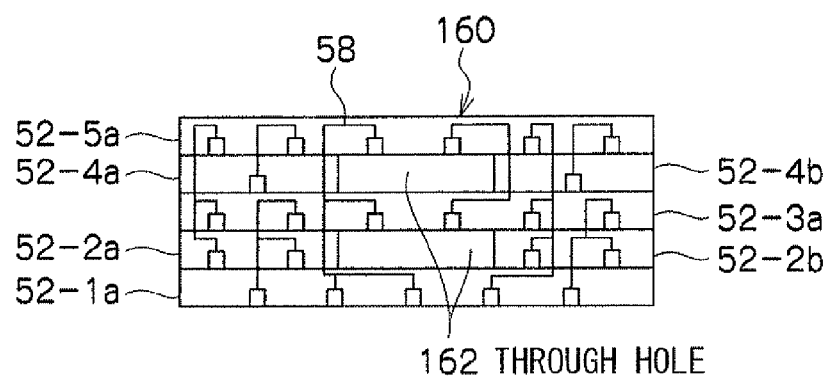
FIG. 17 is a schematic view showing a three-dimensional semiconductor chip module according to a seventh embodiment.
Figure 17B:
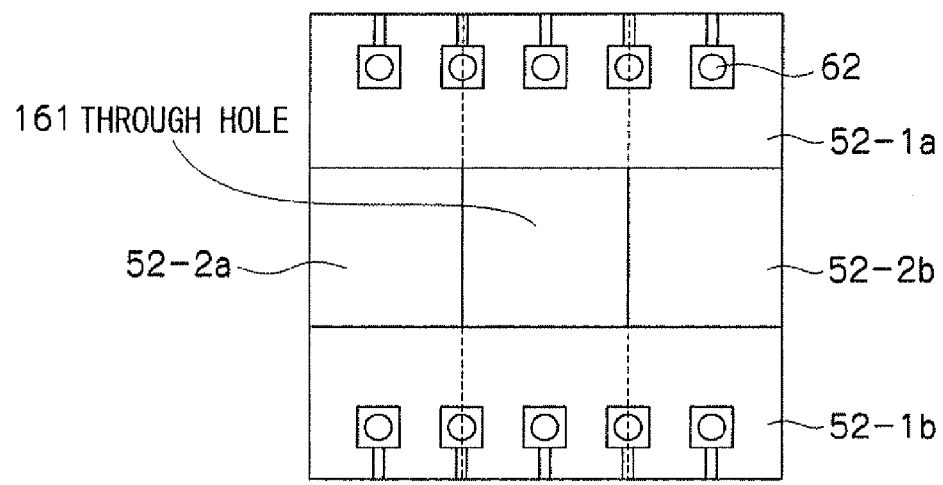

FIG. 17 is a schematic view showing a three-dimensional semiconductor chip module according to a seventh embodiment; FIG. 17A is a front view, and FIG. 17B is a bottom view.

In FIG. 17, a three-dimensional semiconductor chip module 160 according to the seventh embodiment is one in which each layer has two semiconductor chips 52-1a and 52-1b, 52-2a and 52-2b, . . . each having a rectangular shape when ignoring the thickness, and in which the pairs, the semiconductor chips 52-1a and 52-1b, 52-2a and 52-2b, . . . are stacked in a parallel-cross shape. Although they are stacked in a parallel-cross shape, the side faces of the three-dimensional semiconductor chip module 160 are located on planes so that predetermined side faces of each semiconductor chip may be located there.

Since it is a parallel-cross stack, a through hole 161 exists at the center portion when seen from the upper side or the lower side, and a through hole (gap) 162 exists between the two semiconductor chips 52-1a and 52-1b, 52-2a and 52-2b, . . . in one layer when seen from the side face. Both the through holes 161 and 162 are connected at the center portion, and a heat dissipation space is formed by both the through holes 161 and 162.

In the three-dimensional semiconductor chip module 160 according to the seventh embodiment, it can be thought that the even-numbered semiconductor chips function as spacers to form a heat dissipation space for the odd-numbered layers, and that the odd-numbered semiconductor chips function as spacers to form a heat dissipation space for the even-numbered layers.

With the seventh embodiment, since the three-dimensional semiconductor chip module 160 is constituted by stacking two semiconductor chips 52 per layer in a parallel-cross shape, it is possible to provide an inexpensive three-dimensional semiconductor chip module enabling to perform sufficient heat dissipation without complicating manufacture processes and a method for forming the same.

In the seventh embodiment, the aforementioned parallel-cross stacking of two semiconductor chips 52 per layer can be done on the premise of forming the connection terminals on the side faces of the respective semiconductor chips and then forming the interlayer wiring 58 with use of the side faces.

Although FIG. 17 shows one having two semiconductor chips per layer, each layer may have three or more semiconductor chips. Also, the number of the semiconductor chips may differ with each layer. In this case, each of some layers may have one semiconductor chip.

Figure 18:
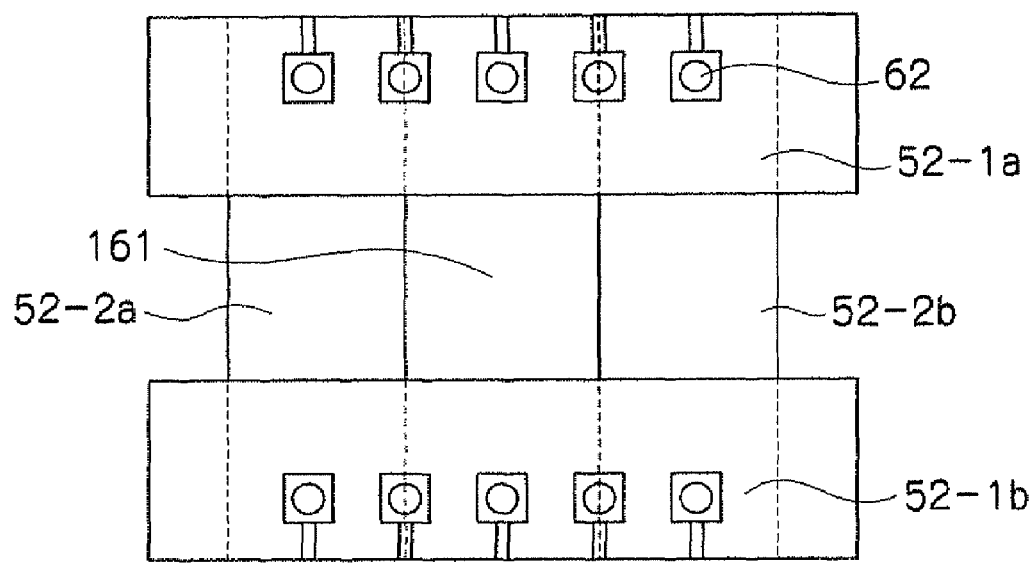
FIG. 18 is a schematic view showing a structure of a three-dimensional semiconductor chip module according to a modification embodiment of the seventh embodiment.

Also, although FIG. 17 shows the stacked three-dimensional semiconductor chip module 160 whose four side faces are all flat, side faces other than those provided with the interlayer wiring 58 may be uneven. For example, as shown in FIG. 18, which corresponds to FIG. 17B, the length of the semiconductor chips in the odd-numbered layers extending in the right-left direction in FIG. 18 may be longer than the length of the semiconductor chips in the even-numbered layers extending in the up-down direction in FIG. 18.

(I) Other Embodiments

Although each of the aforementioned embodiments has shown the semiconductor chip module in which the number of the stacked semiconductor chips is three or five layers, the stacking number is not limited to these.

Also, although each of the aforementioned embodiments has shown one in which a heat dissipation structure is applied to every interlayer, a heat dissipation structure may be applied only to some interlayers. For example, in a semiconductor chip module having five layers, heat dissipation structures may be applied only between the second and third layers and between the third and fourth layers.

Although the fourth and sixth embodiments have shown ones in which heat dissipation structures are provided to both the edges in the right-left direction in the drawings, a heat dissipation structure may be applied only to either edge.

In each of the embodiments having heat dissipation plates or comb-toothed portions extending outside, a heat dissipation fin may be vertically disposed at each extending part.

The techniques and thoughts in each of the above embodiments may be combined and applied if the combination is possible.

INDUSTRIAL APPLICABILITY

A stacked package element, a method for forming a terminal of a stacked package element, a stacked package, and a method for forming a stacked package according to the present invention can target a three-dimensional semiconductor chip module (LSI module) and its component, a semiconductor chip (LSI), for example. Also, a stacked package element, a method for forming a terminal of a stacked package element, a stacked package, and a method for forming a stacked package according to the present invention can be applied to another stacked package such as a stacked printed wiring board.

The invention claimed is:

1. A stacked package comprising:
   a plurality of stacked elements, each element having an exterior surface formed of front and back opposing faces and four side faces extending between and coextensive with the front and back faces;
   a connection terminal on a side face for connection with a circuit pattern formed on the front face;
   interlayer wiring located on a side face and connecting the connection terminals on the side faces of different stacked elements; and
   a heat dissipation void space formed between at least some of the stacked package elements.

2. The stacked package according to claim 1, wherein the heat dissipation void space is formed by partially applying an adhesive attaching adjacent elements in the stacked package, and wherein an edge of the adhesive is included in a side face of the stacked package.

3. The stacked package according to claim 1, wherein the heat dissipation void space is formed by interposing a plurality of spacers between adjacent stacked elements, and
   wherein edge faces of some of the spacers are included in a side face of the stacked package.

4. The stacked package according to claim 1, further comprising a heat dissipation plate extending from the heat dissipation void space to the exterior of the stacked package.

5. The stacked package according to claim 4, further comprising a molded resin covering all of the said stacked elements, wherein the heat dissipation plate penetrates through the molded resin to the exterior of the stacked package.

6. The stacked package according to claim 1, wherein the heat dissipation void space is formed by displacing the stacked elements relative to each other in a direction parallel thereto to form a side face of the stacked package, and
   wherein another a side face of the stacked package has the interlayer wiring thereon.

7. The stacked package according to claim 1, wherein at least some layers of the stacked package elements are formed of in plural elements in the same layer, the plural elements in the same layer being spaced apart to form the heat dissipation void space, and
   wherein, in a layer having plural spaced elements, at least some side faces of the plural element are included in a side face of the stacked package on which the interlayer wiring is formed.

8. The stacked package according to claim 1 wherein the side face with the connection terminal thereon joins the front face at an obtuse angle.

9. The stacked package according to claim 1 wherein the connection terminal and interlayer wiring are oriented on side faces so as to extend from a front face toward a back face.

* * * * *

UNITED STATES PATENT AND TRADEMARK OFFICE
CERTIFICATE OF CORRECTION

PATENT NO. : 7,936,058 B2
APPLICATION NO. : 12/528739
DATED : May 3, 2011
INVENTOR(S) : Hasegawa It is certified that error appears in the above-identified patent and that said Letters Patent is hereby corrected as shown below:

Col. 18, claim 5, line 12, delete "said" after the and before stacked

Col. 18, claim 6, line 19, delete "a" after another and before side

Col. 18, claim 7, line 23, delete "in" after of and before plural

Signed and Sealed this
Ninth Day of August, 2011

David J. Kappos
*Director of the United States Patent and Trademark Office*